United States Patent

Macke, Sr. et al.

[11] Patent Number: 6,137,282
[45] Date of Patent: Oct. 24, 2000

[54] TIME-DOMAIN REFLECTOMETRY USER INPUT DEVICE

[75] Inventors: David C. Macke, Sr., Glendale; Theodore James Eckert, Maryland Heights; John C. Bell, Crestwood; Timothy L. Bell, St. Louis, all of Mo.

[73] Assignee: BECS Technology, Inc., St. Louis, Mo.

[21] Appl. No.: 09/104,817

[22] Filed: Jun. 25, 1998

[51] Int. Cl.[7] .......................... G01R 27/04; H03K 17/94; H03M 11/00
[52] U.S. Cl. ...................... 324/71.1; 324/158.1; 341/22; 341/26
[58] Field of Search .................................. 324/533, 642, 324/71.1, 158.1; 341/22, 23, 26, 33; 345/168

[56] References Cited

U.S. PATENT DOCUMENTS

| | | | |
|---|---|---|---|
| 3,750,012 | 7/1973 | Fellers et al. | 324/642 |
| 4,165,482 | 8/1979 | Gale | 324/642 |
| 5,610,611 | 3/1997 | McEwan | 342/89 |

*Primary Examiner*—Glenn W. Brown
*Attorney, Agent, or Firm*—Polster, Lieder, Woodruff & Lucchesi, L.C.

[57] ABSTRACT

A user input device is disclosed adapting the electronic components of a time-domain reflectometry material level sensor to replace traditional user input devices such as push-buttons, control knobs, and variable sliders. An electrical conductor is arrayed beneath an input panel, such that when a high permittivity or high conductivity material is placed in proximity to the conductor, the characteristic impedance of the conductor is altered at that point, reflecting electronic pulses transmitted through the conductor. The reflected electronic pulse is received by the associated electronics, and the position of the material along the conductor subsequently determined. By segmenting the conductor into virtual regions, each corresponding to an individual "button", discrete input may be received by the device based upon the placement of the material within specific virtual regions. Alternatively, the conductor may function as an infinitely variable "slider" control, with movement of the material along the conductor producing a proportionally varying output signal.

21 Claims, 3 Drawing Sheets

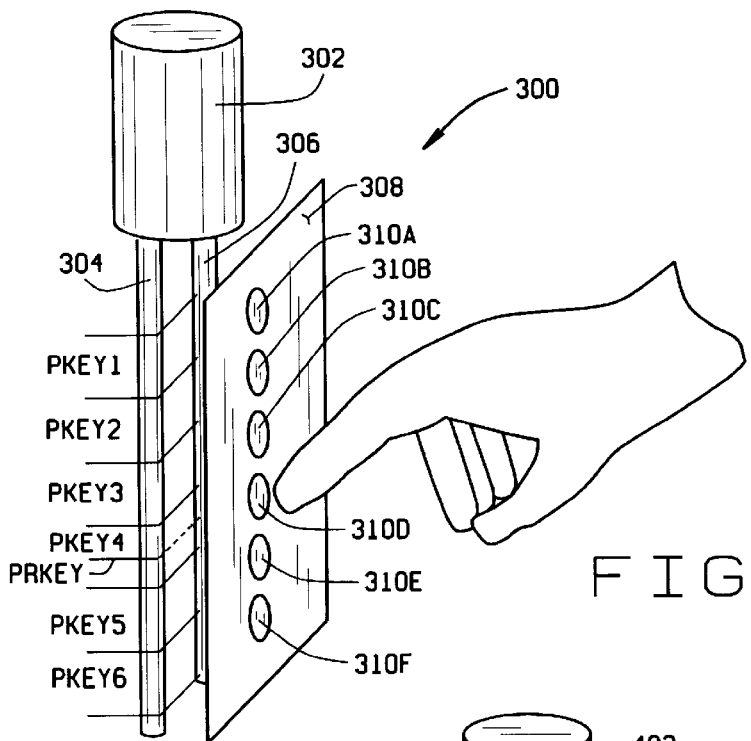
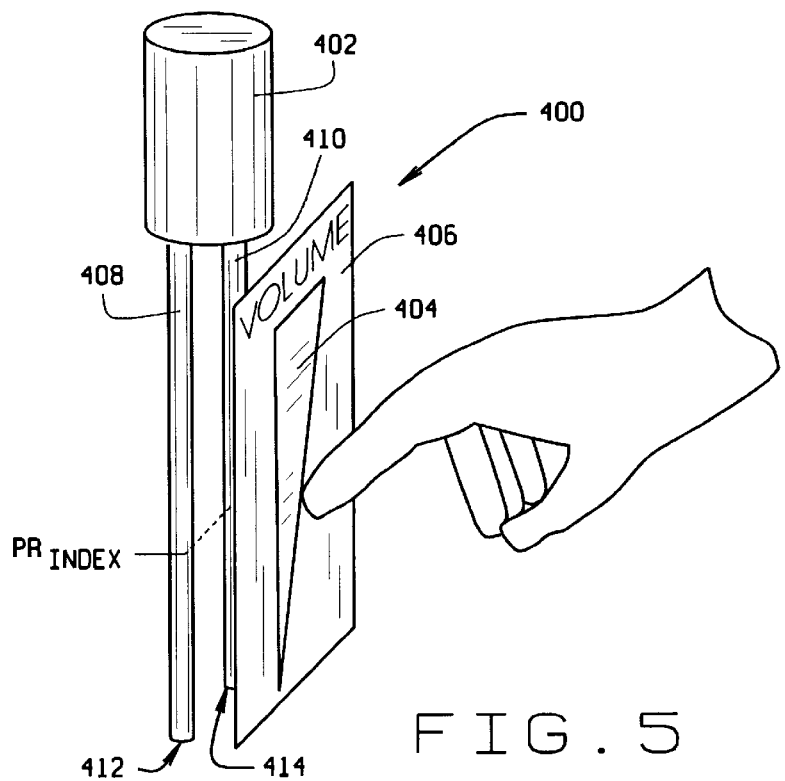

TIME-DOMAIN REFLECTOMETRY USER INPUT DEVICE

BACKGROUND OF THE INVENTION

The present invention relates generally to electronic equipment utilizing time-domain reflectometry to record measurements, and more particularly, to the modification of an electronic time-domain reflectometry material level sensor for use as either a discrete positioning or continuously variable user input device.

In traditional time-domain reflectometry (TDR) systems, the length of (or location of a fault in) a wire cable can be determined by transmitting an electrical pulse down the length of the cable. Any change in the characteristic impedance of the transmission medium, i.e. the wire cable, will result in a reflection of the electronic pulse. Accordingly, upon reaching the end of the cable (or the location of a fault), the transmitted electronic pulse is reflected, and returns down the length of the cable to the point of origin. Since the velocity of the electronic pulse in the wire cable is known, by measuring the time between the transmission of the electronic pulse and the return of the pulse reflection, the distance to the cable end (or fault location) may be precisely determined.

U.S. Pat. No. 5,610,611, to McEwan describes the construction and operation of a high accuracy electronic material level sensor utilizing TDR principles, and is herein incorporated by reference. The McEwan device, shown in FIG. 1, utilizes a precision quartz crystal time base, an ultrawideband directional sampler, and constant fraction discriminators to obtain highly accurate TDR measurements regardless of material dielectric constants and undesired "ghost" reflections. The accuracy achieved with the McEwan device is on the order of 0.1% or better, allowing the device to be used to determine the level of a material (such as a fluid) stored in a tank. A transmission line or guide wire is partially immersed in the material to be measured, and electronic pulses are propagated along the wire by the associated electronic components. Reflections produced in the wire at the material interface, due to changes in the dielectric constant, are correspondingly received and the transmission time of the pulse to the material interface is recorded. The transmission time is then utilized to determine the level of material within the tank.

The present invention adapts the TDR electronics disclosed in McEwan to replace traditional user inputs to electronic devices. User inputs to electronic devices are typically provided by either rotary or linear potentiometers, non-contact capacitive input systems, or by discrete input buttons which mechanically close a contact between two electrical conductors. These traditional user input devices are subject to reliability problems due to wear, breakage, and exposure to environmental elements such as dust and grime which can impede electrical contact. User input devices utilizing TDR electronics require no moving parts or electrical contacts, and offer significant advantages over traditional input devices.

BRIEF SUMMARY OF THE INVENTION

Among the several objects and advantages of the present invention are:

The provision of a user input device for use with electronic devices which utilizes time-domain reflectometry to receive input signals;

The provision of the aforementioned user input device which utilizes dual conductors to eliminate the need for a launch plate and to increase the magnitude of the reflected signal;

The provision of the aforementioned user input device which may be configured to provide discrete input;

The provision of the aforementioned user input device which may be configured to provide continuously variable input;

The provision of the aforementioned user input device which implements multiple input keys or buttons on a single electrical conductor, reducing wiring requirements;

The provision of the aforementioned user input device which utilizes existing TDR technology to provide an inexpensive and reliable replacement for push-button controls, rotary knob controls, and slider controls.

Briefly stated, the user input device of the present invention adapts the electronic components of a time-domain reflectometry material level sensor ("electronic dipstick") to replace traditional user input devices such as push-buttons, control knobs, and variable sliders. An electrical conductor is arrayed beneath an input panel, such that when a high permittivity or high conductivity material is placed in proximity to the conductor, the characteristic impedance of the conductor is altered, producing a reflected electronic pulse. This electronic pulse is received by the associated electronics, and the position along the conductor subsequently determined. By segmenting the conductor into virtual regions, each corresponding to an individual "button", discrete input may be received by the device. Alternatively, the conductor may be treated as an infinitely variable "slider" type control, with any movement of the material along the conductor producing a changed output signal.

The foregoing and other objects, features, and advantages of the invention as well as presently preferred embodiments thereof will become more apparent from the reading of the following description in connection with the accompanying drawings.

BRIEF DESCRIPTION OF THE SEVERAL VIEWS OF THE DRAWINGS

In the accompanying drawings which form part of the specification:

FIG. 4 is a perspective view of a third embodiment of the present invention utilizing dual conductors and configured for discrete input; and FIG. 5 is a perspective view of a fourth embodiment of the present invention similar to FIG. 4, configured for continuously variable input.

Corresponding reference numerals indicate corresponding parts throughout the several figures of the drawings.

DESCRIPTION OF THE PREFERRED EMBODIMENT

The following detailed description illustrates the invention by way of example and not by way of limitation. The description will clearly enable one skilled in the art to make and use the invention, describes several embodiments, adaptations, variations, alternatives, and uses of the invention, including what we presently believe is the best mode of carrying out the invention.

Figure 1:
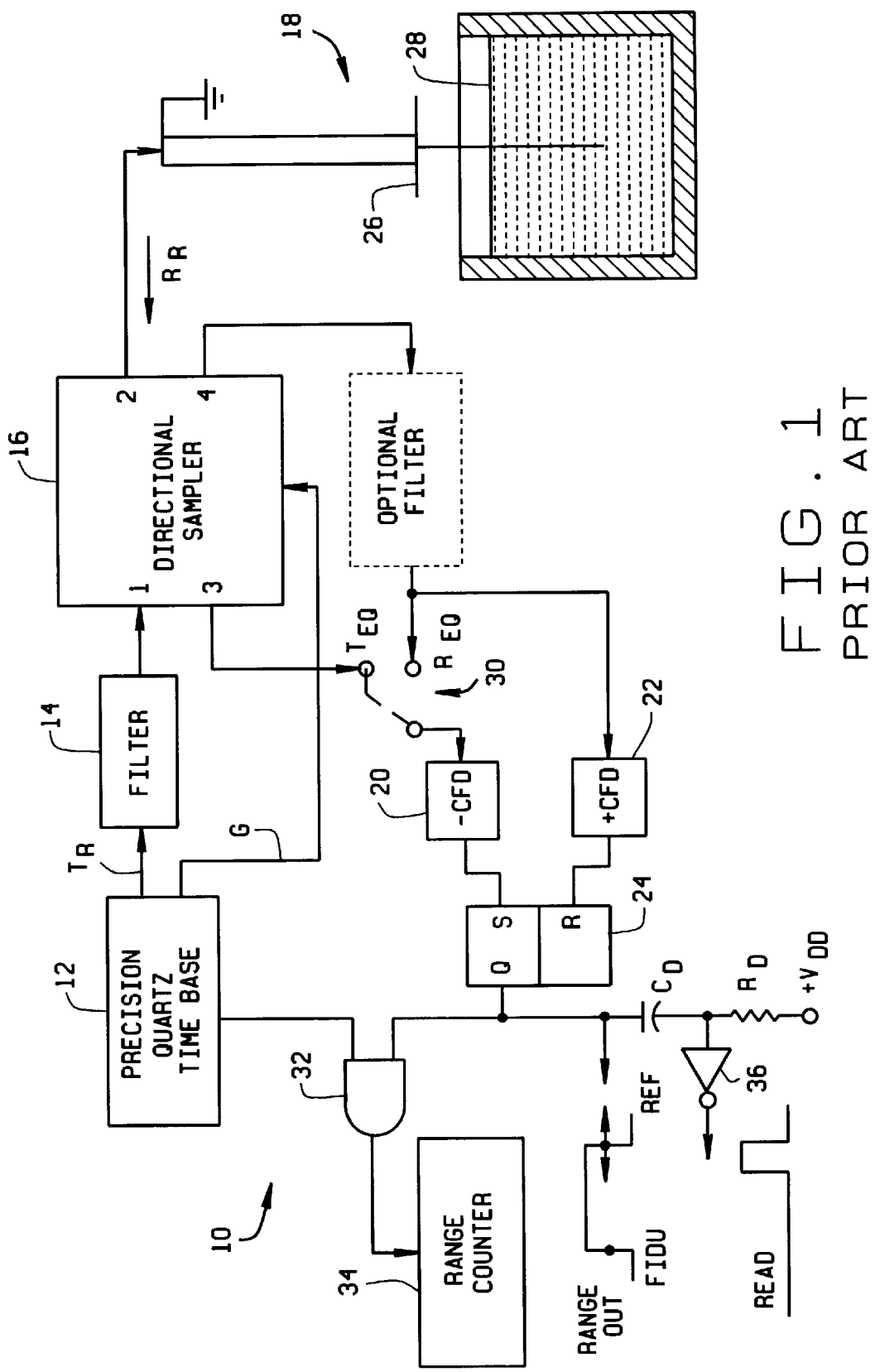
FIG. 1 is a schematic diagram of a prior art high accuracy TDR material level sensor.

Referring now to FIG. 1, a schematic circuit diagram of a prior art TDR device, disclosed in U.S. Pat. No. 5,610,611, is shown generally at 10. A precision quartz time base 12 generates a real-time transmit pulse $T_R$ and a gate pulse G with a precision swept delay between $T_R$ and G. Pulse $T_R$ is applied to a high pass filter 14 to convert the leading edge of $T_R$ into a narrow pulse. A directional sampler 16 receives the transmit pulses $T_R$ at bidirectional port 1 and passes $T_R$ through bi-directional port 2 to the guidewire assembly 18. The sampled equivalent of $T_R$ is passed to output port 3 of the directional sampler as $T_{EQ}$, and any reflected pulses $R_R$ received from the guidewire assembly 18 at port 2 are passed to output port 4 as sampled equivalent signals $R_{EQ}$.

The $T_{EQ}$ output from port 3 is applied to a constant fraction discriminator (−CFD) 20 that threshold detects at a constant fraction of the maximum amplitude of the $T_{EQ}$ pulse, regardless of its amplitude. Similarly, a constant fraction discriminator (+CFD) 22 in the $R_{EQ}$ path performs the same stabilizing function on the $R_{EQ}$ pulse. The two CFD's provide constant thresholding action regardless of pulse amplitude, making the system independent of pulse amplitudes and risetimes.

The outputs of the CFD's 20, 22 are applied to a set-reset flip-flop 24 that provides a variable pulse width output proportional to the time delay between a reflection of $T_R$ from a launcher plate 26 and from the liquid level 28. A toggle switch 30 allows the user to connect either port 3 or port 4 to the input of −CFD 20, thus the liquid level measurement can be referenced from either the launcher plate 26 or from the transmit pulse. To provide a numerical measurement, the output of flip-flop 24 is routed through AND gate 32 with a clock pulse from time base 12, to provide a burst to a range counter 34. Each burst corresponds to 0.001", with bursts supplied to the range counter from −CFD 20 until a signal from +CFD 22 is received. The negative transition from the flip-flop 24, labeled REF is differentiated by $C_D$, $R_C$ to provide a READ command at the output of an inverter 36.

Figure 2:
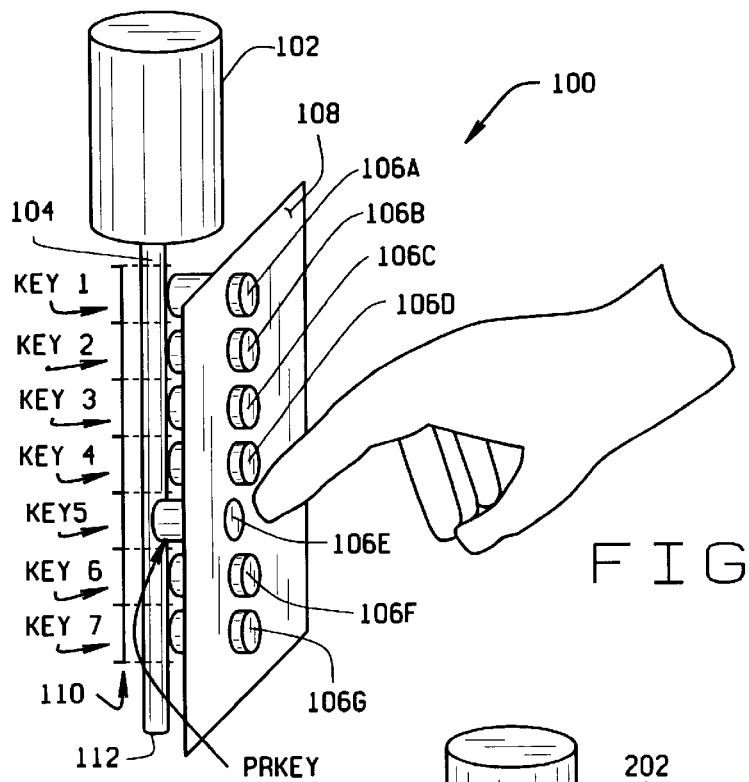
FIG. 2 is a perspective view of a first embodiment of the present invention utilizing a single conductor and configured for discrete input.

Turning now to FIG. 2, a first preferred embodiment of the user input device of the present invention is shown generally at 100. The electronic components of the TDR material level sensor described above are shown at 102 with an electrical cable 104 connected thereto, replacing the guidewire assembly 18 shown in FIG. 1. The electrical cable is disposed adjacent the rear side of a linear array of push-button keys, 106A–106G, which are installed in the front face of a panel 108. One skilled in the art will readily recognize that the push-button keys may be arranged in a variety of custom configurations, and that the electrical cable may be routed along an appropriately curved path adjacent the push-button keys. Each push-button key 106A–106G is comprised of either a high permittivity or high conductivity material. The act of pressing a push-button key displaces the key in the panel 108 such that a portion of the depressed key is positioned either in contact with the electrical cable 104, or in close proximity thereto on the opposite face of the panel 108. Each push-button key includes a conventional return mechanism (not shown), capable of returning a key to the default or rest position upon release, or upon the selection of another key.

Depressing a push-button key 106 into contact with, or into close proximity to, the electrical cable 104 alters the characteristic impedance of the electrical cable at the point closest to the push-button key, indicated in FIG. 2 by $R_{KEY}$. Electronic pulses continually transmitted down the electrical cable by the TDR electronic components 102 are reflected at $R_{KEY}$, providing a distance measurement along the electrical cable 104 corresponding to the distance from the pulse source to the particular push-button key 106 which is pressed. A virtual mapping of the length of the electrical cable 104, shown by line 110 in FIG. 2, includes segments labeled KEY1–KEY7, corresponding to the portions of the electrical cable within which $R_{KEY}$ occurs for each individual push-button key 106A–106G.

As described above, the TDR electronics 102 determine the distance from the source of the electronic pulse to the point of reflection along the electrical cable 104. This distance is then compared with the virtual mapping 110, such that the KEY segment within which the reflection point $R_{KEY}$ is found corresponds to the push-button key 106 which has been depressed. If no push-button key is currently depressed, the electronic pulse transmitted through the electrical cable reflects from the terminal end 112 of the cable, signaling a no-input condition for the push-button keys 106A–106G.

Figure 3:
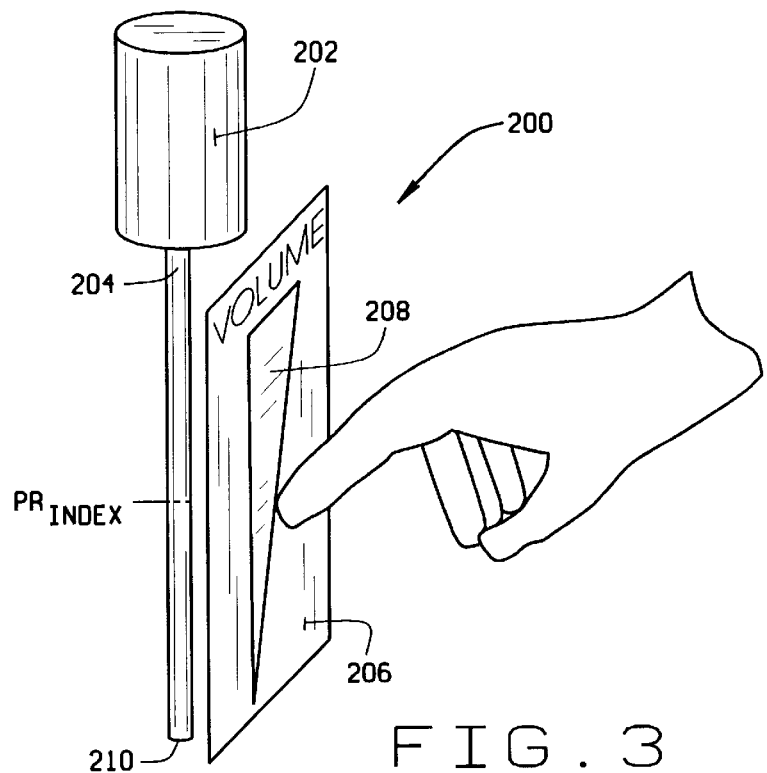
FIG. 3 is a perspective view of a second embodiment of the present invention similar to FIG. 2, configured for continuously variable input.

In FIG. 3, a second preferred embodiment of the user input device is shown generally at 200. As shown in FIG. 2, the electronic components of the TDR material level sensor described above are shown at 202 with an air dielectric electrical cable 204 connected thereto, again replacing the guidewire assembly 18 shown in FIG. 1. The air dielectric electrical cable is disposed adjacent to, and rearward of, a membrane or panel 206 having a control index 208 marked thereon. The control index 208 shown in FIG. 3 corresponds to a continuously variable sliding scale control, such as is commonly employed for volume control of audio equipment.

The characteristic impedance of the air dielectric electrical cable 204 is altered by an operator placing an index marker, such a finger or other highly conductive material, at any point along the control index 208, in proximity to the cable. Electrical pulses transmitted down the cable by the TDR electronic components 202 are reflected back to the pulse source from the point along the cable at which the characteristic impedance is altered, indicated in FIG. 3 by $R_{INDEX}$. The reflected pulses are interpreted by the electronic components 202 as distance measurements along the length of the electrical cable 204, providing a direct input reading corresponding to a desired level of operator input. By sliding the index marker along the control index 208, an operator may continuously vary the input level to the electronic components 202. If no index marker is positioned adjacent the control index 208, electrical pulses transmitted down the air dielectric cable 204 reflect from the terminal end 210 of the cable, signaling a no-input condition.

A third preferred embodiment of the present invention is shown generally at 300 in FIG. 4. As shown in FIG. 2, the electronic components of the TDR material level sensor described above are shown at 302 with a pair of parallel electrical cables 304 and 306 connected thereto, replacing the guidewire assembly 18 shown in FIG. 1. The parallel electrical cables are disposed adjacent to, and rearward of, a membrane or panel 308 having a number of control indices 310A–310F marked thereon. Replacement of the guidewire assembly 18 of FIG. 1 with a pair of electrical cables 304 and 306, arranged in a parallel configuration, eliminates the need to include a launch plate 26, shown in FIG. 1, and increases the magnitude of reflected electrical pulses.

The parallel electrical cables 304 and 306 shown in FIG. 4 are air dielectric cables, and the characteristic impedance of the cable is altered by an operator placing an index marker, such a finger or other highly conductive material, at a specific point on the membrane or panel 308 corresponding to one of the control indices 310A–310F. Electrical pulses transmitted down the cables by the TDR electronic components 302 are reflected back to the pulse source from the parallel points on each cable at which the characteristic impedance is altered, indicated in FIG. 4 by $PR_{KEY}$. The reflected parallel pulses are interpreted by the electronic components 302 as distance measurements along the lengths of the air dielectric cables 304 and 306. These distance measurements are then compared with virtual segments PKEY1–PKEY6 mapped to the lengths of the cables, to determine the selected control index 310A–310F. If no control index is selected, the electrical pulses transmitted down the cables 304 and 306 will reflect from the terminal ends 312 and 314 of the cables, indicating a no-input condition.

Turning to FIG. 5, a fourth preferred embodiment of the user input device of the present invention is shown generally at 400. The user input device 400 combines a sliding scale control index 404 and panel 406, the function of which is described in reference to FIG. 3, with parallel air dielectric cables 408 and 410, the function of which is described in reference to FIG. 4. Placement by an operator of an index marker, such as a finger or other highly conductive material against the sliding scale control index alters the characteristic impedance of the air dielectric cables 408 and 410 adjacent the point of contact, as indicated at $PR_{INDEX}$. The altered impedance of the cables produces a reflection of the transmitted electrical pulses, which is received by the TDR electronics 402, and translated into a control signal corresponding to the desired level of input signaled by the operator. If no index marker is placed adjacent the control index, the transmitted electrical pulses reflect from the terminal ends 412 and 414 of the cables, signaling a no-input condition.

Those skilled in the art will recognize that the TDR electronics described above and shown in the accompanying figures are but one of several variations in TDR circuitry which may be employed with the present invention. Other TDR electronics, for example, a circuit employing an RC oscillator instead of a quartz oscillator, may be readily adapted for use with the user input device of the present invention, and accordingly are considered within the scope of the invention.

Similarly, those skilled in the art will recognize that numerous other combinations of conducting cables, including parallel configurations, air dielectric cables, and coaxial cables may be employed with both discrete and continuously variable controls such as push-buttons and sliding-knobs, and are also within the scope of this invention. A coaxial conducting cable may employ either air or plastic as a dielectric medium, such that the characteristic impedance of the cable is altered by a slight deformation of the outer conductor, such as by a pressing contact.

In view of the above, it will be seen that the several objects of the invention are achieved and other advantageous results are obtained. As various changes could be made in the above constructions without departing from the scope of the invention, it is intended that all matter contained in the above description or shown in the accompanying drawings shall be interpreted as illustrative and not in a limiting sense.

What is claimed is:

1. A method for utilizing time-domain reflectometry to provide discrete user input into electronic equipment, comprising the steps of:
    establishing at least one defined portion of an electrically conductive element, said at least one defined portion corresponding to at least one discrete user input element;
    mapping said at least one defined portion to said at least one discrete user input element;
    altering a characteristic impedance of said electrically conductive element within said at least one defined portion, said altered characteristic impedance corresponding to a user input;
    determining within which said at least one defined portion said altered characteristic impedance occurs; and
    generating a signal indicating which discrete user inputs is mapped to said determined at least one defined portion.

2. The method of claim 1 wherein said electrically conductive element is an air dielectric wire.

3. The method of claim 1 wherein said electrically conductive element is a pair of conductive wires arrayed in a closely spaced parallel configuration.

4. The method of claim 1 wherein the step of altering the characteristic impedance of said electrically conductive element includes placing a high conductivity material in proximity to said electrically conductive element.

5. The method of claim 1 wherein the step of altering the characteristic impedance of said electrically conductive element includes placing a high permittivity material in proximity to said electrically conductive element.

6. The method of claim 5 wherein said high permittivity material is a push-button.

7. The method of claim 6 wherein said high conductivity material is a human finger.

8. The method of claim 1 wherein said electrically conductive element is a coaxial conductor.

9. The method of claim 8 wherein the step of altering the characteristic impedance of said electrically conductive coaxial conductor includes temporarily deforming said coaxial conductor.

10. A discrete user input device utilizing time-domain reflectometry circuitry, comprising:
    a support means configured with a plurality of discrete user input indicia on a first face thereof; and
    a conducting element secured adjacent an opposite face of said support means oppositely adjacent said discrete user input indicia, said conducting element electrically connected to said time-domain reflectometry circuitry to receive periodic electrical pulses therefrom, said conducting element configured to reflect said periodic electrical pulses to said time-domain reflectometry circuitry from at least one point along said conducting element having a characteristic impedance altered by user interaction with said discrete user input indicia, said reflected periodic electrical pulses representative of discrete user input.

11. The discrete user input device of claim 10 wherein said plurality of discrete user input indicia comprises a plurality of push-buttons, said push-buttons comprising high permittivity material and configured to alter the characteristic impedance of said conducting element when depressed into close proximity to said conducting element.

12. A method for utilizing time-domain reflectometry to provide continuously variable user input into electronic equipment, comprising the steps of:
    establishing at least one defined portion of an electrically conductive element, each said at least one defined portion corresponding to a range of continuously variable user inputs;
    mapping the length of each said at least one defined portion to values comprising said range of continuously variable user inputs;

altering the characteristic impedance of said electrically conductive element within at least one of each said at least one defined portions, said altered characteristic impedance corresponding to a user input;

determining within which said at least one defined portion said altered characteristic impedance occurs;

measuring the location within said at least one defined portion at which said altered characteristic impedance occurs; and generating a signal representative of said continuously variable user input, said signal corresponding to said value mapped to said measured location within said at least one defined portion of said electrically conductive element.

13. The method of claim 12 wherein said electrically conductive element is an air dielectric wire.

14. The method of claim 12 wherein said electrically conductive element is a pair of conductive wires arrayed in a closely spaced parallel configuration.

15. The method of claim 12 wherein said electrically conductive element is a coaxial cable, and the step of altering the characteristic impedance of said electrically conductive element includes temporarily deforming said coaxial cable.

16. The method of claim 12 wherein the step of altering the characteristic impedance of said electrically conductive element includes placing a high permittivity material in proximity to said electrically conductive element.

17. The method of claim 16 wherein said high permittivity material is a slide-knob.

18. The method of claim 12 wherein the step of altering the characteristic impedance of said electrically conductive element includes placing a high conductivity material in proximity to said electrically conductive element.

19. The method of claim 18 wherein said high conductivity material is a human finger.

20. A continuously variable user input device utilizing time-domain reflectometry circuitry, comprising:

a support means configured with at least one continuously variable input indicia on a first face thereof; and a conducting element secured adjacent an opposite face of said support means opposite said at least one continuously variable input indicia, said conducting element electrically connected to said time-domain reflectometry circuitry to receive periodic electrical pulses therefrom, said conducting element configured to reflect said periodic electrical pulses to said time-domain reflectometry circuitry from at least one point along said conducting element having a characteristic impedance altered by user interaction with said at least one continuously variable input indicia, said reflected periodic electrical pulses representative of a continuously variable user input.

21. The continuously variable user input device of claim 20 wherein said at least one continuously variable input indicia comprises a sliding knob configured to displace a high permittivity material along the length of said conducting element, altering the characteristic impedance of said conducing element adjacent said material.

* * * * *